United States Patent [19]

Kinser, Jr. et al.

[11] Patent Number: 4,878,293

[45] Date of Patent: Nov. 7, 1989

[54] METHOD OF INTERCONNECTING ASSEMBLIES USING TORSIONLY STRESSED CONDUCTORS ROUTED THROUGH A HOLLOW ARTICULATED HINGE

[75] Inventors: Ralph W. Kinser, Jr.; David L. Shriver; Judith A. Layman, all of Corvallis, Oreg.

[73] Assignee: Hewlett-Packard Company, Palo Alto, Calif.

[21] Appl. No.: 238,708

[22] Filed: Aug. 31, 1988

Related U.S. Application Data

[62] Division of Ser. No. 868,401, May 29, 1986, Pat. No. 4,825,395.

[51] Int. Cl.$^4$ .............................................. H05K 3/02
[52] U.S. Cl. ......................................... 29/850; 29/846
[58] Field of Search .................. 29/846, 850; 361/413, 361/414; 364/708

[56] References Cited

U.S. PATENT DOCUMENTS

| 4,155,615 | 5/1979 | Zimmerman, Jr. et al. ...... 29/842 X |
| 4,264,962 | 4/1981 | Kodawa .............................. 364/708 |
| 4,343,084 | 8/1982 | Wilmarth .......................... 29/842 X |
| 4,497,036 | 1/1985 | Dunn ................................... 364/708 |
| 4,517,660 | 5/1985 | Fushimoto et al. ................. 364/708 |
| 4,571,456 | 2/1986 | Paulsen et al. .................. 364/708 X |
| 4,667,299 | 5/1987 | Dunn ................................... 364/708 |

FOREIGN PATENT DOCUMENTS

| 66664 | 12/1982 | European Pat. Off. . |
| 66046 | 5/1980 | Japan ................................... 364/708 |
| 225920 | 11/1985 | Japan ................................... 364/708 |

Primary Examiner—Timothy V. Eley
Assistant Examiner—Frances Chin
Attorney, Agent, or Firm—Edward L. Miller

[57] ABSTRACT

Conductors of a flexible printed circuit routed through a hollow two axis articulated hinge allow a calculator with rotating case halves to possess a keyboard portion in each half of the case. The conductors routed through the hollow articulated hinge are generally centered about one axis of hinge rotation for approximately half the length of the axis, whereupon they transition by either a U-turn or jog to continue as centered about the other axis of hinge rotation. The conductors may be an integral part of a flexible membrane keyboard assembly having portions located in both halves of the calculator's case. Strain reliefs at the locations where the conductors traverse the case halves, and two in the hinge, at about the center thereof, limit and apportion the torsional flexing experieced by the conductors. The torsional flexing experienced by the flexible conductors increases the number of cycles of rotation they can undergo without breaking, as compared to conventional bending. The hollow articulated hinge allows one case half to rotate one full revolution about the other, so that the calculator can be opened and held in one hand. By being within the hollow hinge the conductors are protected from injury.

2 Claims, 8 Drawing Sheets

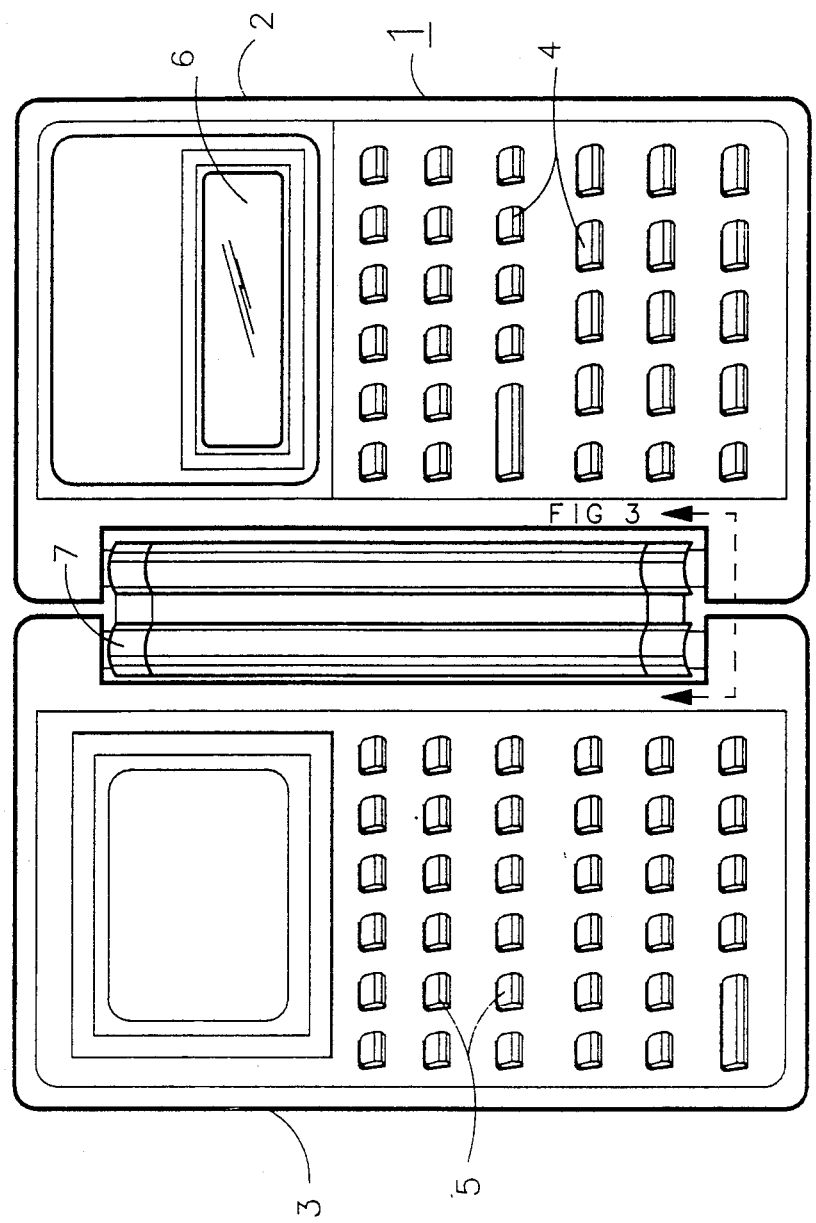

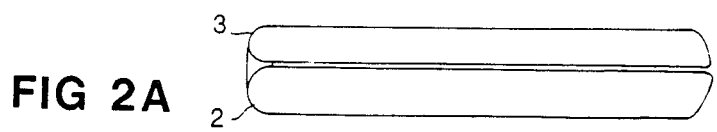
FIG 2A — CLOSED
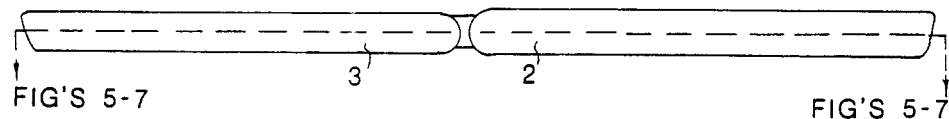
FIG 2B
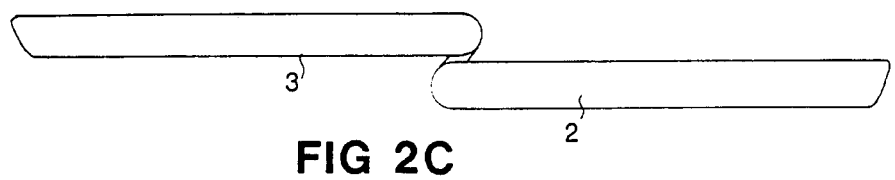
FIG 2C
FIG 2D
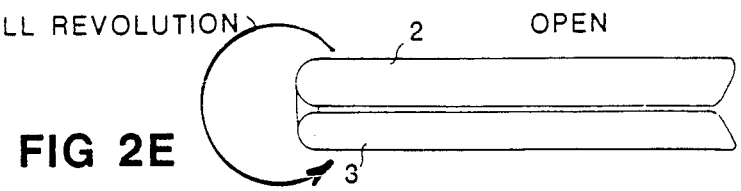
FIG 2E — ONE FULL REVOLUTION — OPEN

METHOD OF INTERCONNECTING ASSEMBLIES USING TORSIONLY STRESSED CONDUCTORS ROUTED THROUGH A HOLLOW ARTICULATED HINGE

CROSS REFERENCE TO RELATED PATENT

This application is a division of U.S. Pat. No. 4,825,395 which issued on Apr. 25, 1989 after being filed on May 29, 1986, Ser. No. 868,401 by Ralph W. Kinser, David L. Shriver and Judith A. Layman and assigned to Hewlett-Packard Co.

BACKGROUND AND SUMMARY OF THE INVENTION

It sometimes happens that electrical conductors must be routed between rotatable portions of an apparatus. For example, in one small folding pocket calculator, that when closed is about one quarter of an inch thick and approximately the length and width of a credit card, the two sections that fold are joined by a hinge. One section carries the display, while the other carries the keyboard and processing means. In such a calculator it is necessary to connect the display to the processing means with several conductors that traverse the hinge. One solution is to simply route the conductors of a flexible printed circuit along the inside surface of the hinge and at right angles to the axis of hinge rotation. The hinge itself may be a strip or flap of flexible material (e.g., cloth), and may allow nearly three hundred and sixty degrees of rotation. With such a solution the radius of the hinging action also essentially determines the bending radius of the conductors. It is frequently desired that the radius of the hinge be small, as any increase in that radius adds to the size of the apparatus. However, as the radius decreases there is an increase in the bending stress incurred by the conductors. Each cycle of rotation applies compression and tension to the conductors. A clear concern in such instances arises for the ability of the conductors to resist breakage after some number of cycles of rotation. A second concern is how to protect the conductors from accidental injury, since in the absence of such protection they are exposed whenever the calculator is opened for use. A common solution in these cases is to simply cover the conductors with a flap of flexible protective material, such as vinyl or cloth. Such a measure is less than foolproof, since the protective flap is itself susceptible to injury, and may be cut or punctured by sharp objects.

As another example, the Hewlett-Packard Model 110 portable computer has a non-articulated hinged display section that rotates about a single axis, so that the display may be unlatched and made visible by rotating it away from the main portion of the computer. The conductors connecting the display section with the main portion of the computer are routed along the axis of rotation in the main portion before entering a hollow hinge. The hinge is formed from two fixed arms that extend from the display section and that rotate about respective distal captive annular sections. The conductors are individual insulated wires in a bundle anchored in a first location by a first strain relief at the point where the bundle enters on of the annular sections of the hinge. Thereafter, the bundle remains fixed in relation to the display as they both rotate together relative to the main body of the computer. Along the bundle in the other direction (i.e., from the strain relief in the display section back toward the main portion of the computer) there is a second strain relief anchoring to the main portion of the computer a second location of that part of the bundle running along the axis of the hinge. At the second location the bundle remains fixed in relation to the main body of the computer. Generally speaking, the first and second locations of strain relief are at opposite ends of that section of the bundle that runs along the axis of hinge rotation. The portion of the bundle between the two strain reliefs thus experiences distributed torsional stress during the rotational excursions of the display section. Such distributed torsional stress is superior to the locally concentrated stresses of compression and tension found in conventional bending. Unfortunately, the hinge and torsional method just described may not be applicable where the amount of rotation desired approaches one complete revolution.

It would be desirable if a pocket calculator or other device could enjoy the benefits of torsional flexing of the conductors connecting rotating parts in an application where the parts were capable of rotating through a complete revolution.

Torsional flexing of conductors, as well as other objects of the invention, may be realized in a design that incorporates a hollow intervening member serving as an articulated hinge between the two parts or assemblies to be interconnected. The term "articulated hinge" means that there are two parallel axes of rotation; a first axis between the intervening member and the casing of a first assembly, and a second axis between the intervening member and the casing of the second assembly. The means that make the articulated hinge captive to the other assemblies does so by having a hollow spindle portion of one part extend a short distance into a corresponding socket portion of another. The end of the hollow spindle portion and the floor of the socket portion each have matching holes that are in alignment, and that are centered about the axis of rotation. In this way an interior passage is formed between the first assembly and the hollow articulated hinge, and then further between the hinge and the second assembly. The result is a well protected interior passage between the first and second assemblies. Several flexible printed circuit traces are routed from one assembly to the other. Each axis of rotation of the articulated hinge is limited to a total displacement of approximately one hundred and eighty to two hundred degrees. The two assemblies can thus move through one complete revolution relative to one another.

The traces of the flexible printed circuits are strain relieved at four places: once upon leaving each assembly to enter the articulated hinge along the associated axis, and twice approximately in the center of the articulated hinge (once on either side of where the flexible printed circuits transition from one axis to the other). The strain relief limits the amount of torsion the flexible printed circuit traces experience at any one place, and apportions the torsion to two separate portions of those traces in accordance with how each assembly is rotated relative to the articulated hinge.

A further object realized by the above-described invention is that of protecting the conductors from damage. This result obtains because the conductors remain fully encased as they go from one assembly to the other.

Still other objects are realized by the invention when the first and second assemblies comprise the top and bottom case halves of a small handheld calculator.

These include an easy way to locate keypads on both halves of the case, and the related object of allowing the use of one flexible membrane keyboard assembly to interconnect the two keypads and the processing means.

BRIEF DESCRIPTION OF THE DRAWINGS

FIG. 1 is a top view of a handheld calculator having two keypads connected by torsionally flexed conductors routed through an articulated hinge.

FIGS. 2A–2E are various end views of the calculator of FIG. 1, illustrating the operation of the articulated hinge.

DETAILS OF A PREFERRED EMBODIMENT

Figure 3:
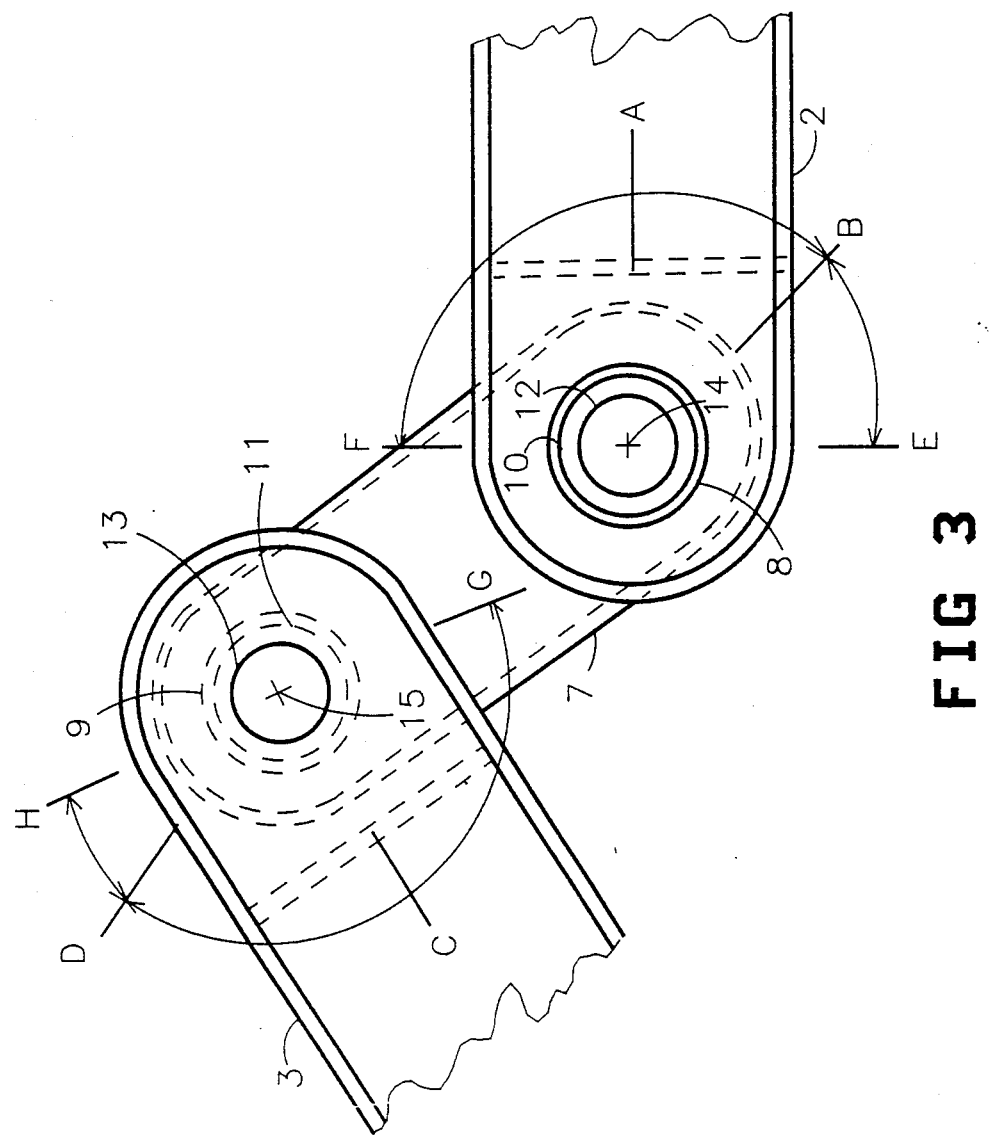
FIG. 3 is a sectional view of a portion of FIG. 1, showing details of the articulated hinge.

FIG. 1 shows a handheld calculator 1 whose construction embodies the principles of the invention. The calculator 1 has a folding case that includes two case halves 2 and 3. Upon each case half 2 and 3 is located a respective keypad 4 and 5. The two keypads 4 and 5 are electrically connected to a processing means (not shown) which responds to keystrokes and presents information upon a display 6. One problem, then, is the establishment of electrical connections between the two keypads 4 and 5, so that they appear to the processing means as a single keypad. A more general statement of the problem is how to electrically connect something located in one half of the case to something in the other half of the case. This is accomplished by the flexible membrane keyboard assembly 16 shown in FIG. 4, in conjunction with the hollow articulated hinge 7 in FIG. 1.

As stated earlier, what is meant by the term "articulated hinge" is a hinge having two parallel axes or rotation. FIG. 2 shows what types of motion between the two case halves 2 and 3 the articulated hinge 7 affords. FIG. 2A shows an end view of the calculator 1 with the case halves 2 and 3 in their closed positions. FIG. 2B illustrates the normal fully open position that would be used if the calculator were laid upon a flat surface. FIGS. 2C and 2D illustrate other full open positions that are obtainable through the action of the articulated hinge. FIG. 2E shows how the calculator 1 may opened for use by rotating case half 3 one full revolution. This conveniently allows the calculator to be held in one hand while the other is used to actuate the keys upon the keypad 4. Keypad 4 contains most of the keys used to perform simple calculations.

FIG. 3 further illustrates certain details of the articulated hinge 7. FIG. 3 is a sectional view of a portion of FIG. 1. Articulated hinge 7 is a generally hollow member of (in the present embodiment) oval cross section and length sufficient to prevent undue twisting that would cause the two axes of rotation 14 and 15 to not lie in the same plane.

For the sake of illustration, two different ways of joining the hinged elements are shown. In the case of axis 14, circle 8 represents a hole (socket) in case half 2 into which a raised annular projection (spindle) from member 7 protrudes, as indicated by circles 10 and 12. Additionally, circle 12 indicates a passage from the interior of case half 2 into the interior of articulated hinge member 7.

The circumstances for hinging about axis 15 are somewhat different. There, a raised annular projection (spindle) from case half 3 protrudes into a hole 9 (socket) in the member 7. Circles 11 and 13 denote the raised annular projection. Hole 13 also indicates a passage from within the case half 3 into the articulated hinge member 7. It will be understood from a general understanding of FIGS. 1, 3, and 8 that the same situation as depicted in FIG. 3 obtains at the other end of the articulated hinge member 7. That is, a conductor could enter member 7 from case half 2 through hole 12 and then enter case half 3 through either hole 13 or its counterpart (not shown) at the other end of member 7. It will also be understood that any desirable combination of parts protruding into other parts may be used to make the case halves 2 and 3 captive to the articulated hinge member 7.

We now turn to another property of the articulated hinge 7 shown in FIG. 3; rotational constraint. It is clear from FIGS. 1-3 that, even in the absence of any other mechanism, interference between case halves 2 and 3 will act to place some limits on the relative rotation of members 2, 3, and 7 about each other. Although the mechanism for it is not expressly shown in the drawing (which is complicated enough already) it may be desirable to equip the articulated hinge 7 with some type of stops. These could be interfering bosses or lugs, or lugs traveling in grooves of limited extent. Any convenient way may be used to limit the hinge's extent of rotation, so long as it does not interfere with the principal action of the hinge, which includes the passage of conductors through a hole centered upon the axis of rotation.

As shown in FIG. 3, articulated hinge member 7 is rotated about axis 14 approximately forty-five degrees clockwise with respect to a center position that would align it with case half 2. In such an aligned state lines A and B would coincide. In like fashion, case half 3 is depicted as rotated approximately seventy degrees counter-clockwise about axis 15, relative to a center position that would align it with articulated hinge member 7. If the case half 3 were aligned with member 7 then lines C and D would coincide. The rotational stop mechanism mentioned in the previous paragraph would operate to produce the following results. Line B, representing a point on the articulated hinge member 7, would be constrained to rotate between the extent delimited by lines E and F, which represent points upon the surface of the case half 2. Similarly for the hinge about axis 15, line D would be constrained by lines G and H. It will be understood that the limits described here are approximate, and need not be the exact one hundred and eighty degrees suggested by FIG. 3. What is important is that limits are provided if they do not otherwise obtain through the natural interference of the parts being hinged, or if that natural interference is otherwise undesirable or counter-productive (say, it causes chipped paint, or perhaps pinched fingers). In the calculator 1 of FIG. 1 such additional constraint is provided by the hinge, and the angle of displacement from F to E and G to H is approximately one hundred and ninety degrees.

The case halves 2 and 3 and the articulated hinge 7 may be constructed of any suitable material. For the calculator 1 these parts are made of molded polycarbonate, which is light in weight but still strong enough to provide adequate rigidity.

Figure 4:
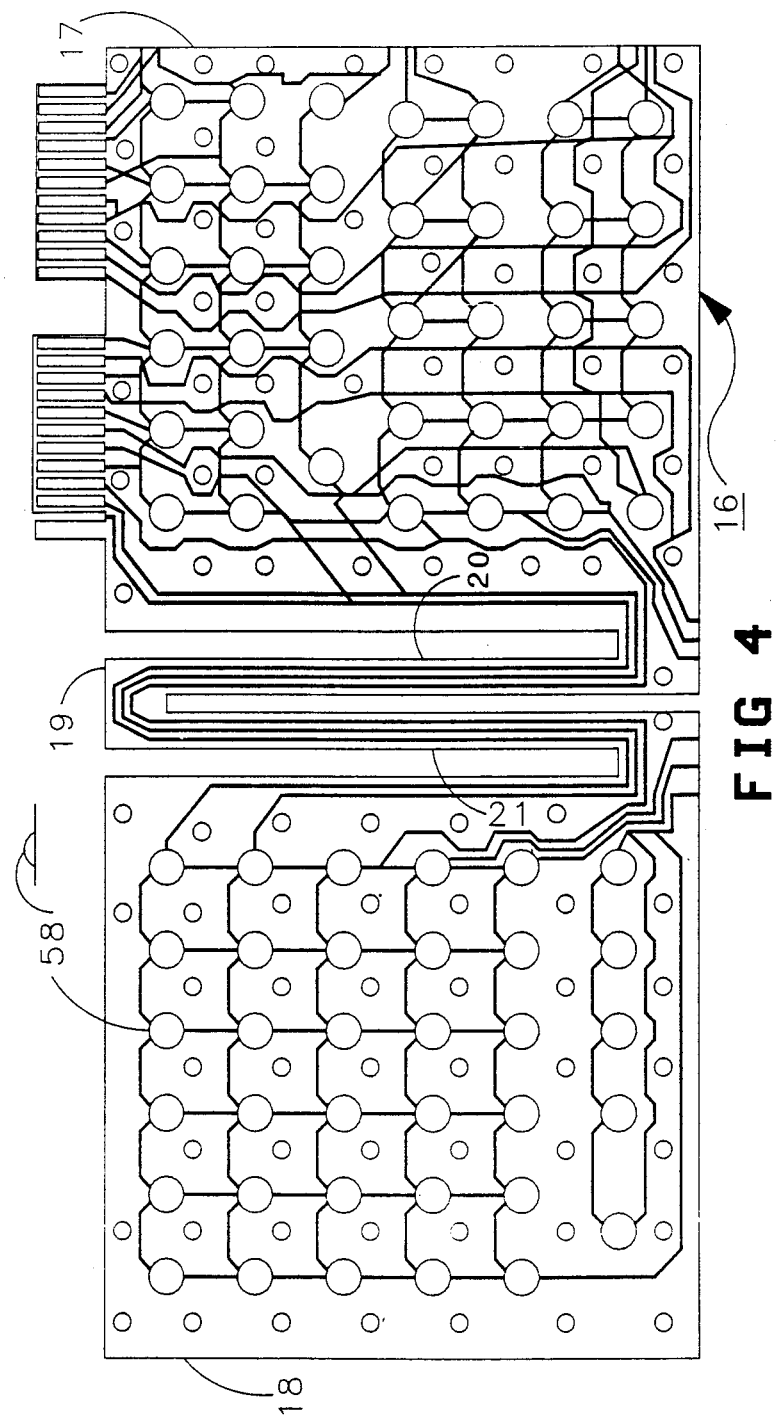
FIG. 4 is a top view of a flexible membrane keyboard assembly used in the calculator of FIG. 1, and having a U-shaped section for transiting the articulated hinge of the calculator of FIG. 1.

Refer now to FIG. 4, wherein is shown a top view of a multi-layer flexible membrane keyboard assembly 16 comprising two halves 17 and 18 joined by a U-shaped section 19. Because it is multi-layer, many more than the three conductors shown in the U-shaped section actually pass between the two halves 17 and 18.

Circles 58 represent compressible dome sections that are in mechanical contact with the keys of the keyboards. They serve to provide an "overcenter" sudden collapse when the keys are pressed, providing useful tactile feedback to the user of the calculator 1. They also provide the spring-like force that returns a pressed key to its normal position. Underneath each dome 58 is a region where two conductors are normally in close proximity to each other, but do not touch. When the dome 58 is collapsed the two conductors are brought into ohmic contact.

Flexible membrane keyboard assembly 16 is fabricated by silk screening traces of a silver paste onto sheets of polyester. Etched copper traces are feasible as well, although they are stiffer and fail after fewer cycles of rotation.

Tests conducted by the inventors revealed the following information, offered here for its comparative value only. Lengths of single layer multi-trace flexible conductors, such as portion 22 of FIG. 4 and variously constructed as described above, were subjected to extend torsional flexing. Runs two inches long of silver paste on polyester were clamped at one end and repeatedly twisted through one hundred degrees either side of their normal, unstressed positions. The traces ranged from fifteen to twenty-mils wide, and from seven tenths to one mil thick. Testing on these samples were halted after over three million two hundred degree excursions resulted in no failures in the conductors. When similar tests were run with 1.4 mil copper on polyester, failures occurred after about one and a quarter million cycles.

In comparison, conventional bending was performed with a radius of 0.150 inches. Copper traces failed after several thousand cycles of plus and minus one hundred and eighty degree bending. The silver traces lasted between five and ten thousand cycles.

The reason for this difference appears to be that conventional bending subjects the traces to considerably greater stresses of compression and tension during the bending cycles. As a ribbon of conductor is curved the inside surface is compressed, while the outer surface experiences tension. We recognize that torsional stress is probably not a wholly separate phenomenon, and that one way to describe torsion is in terms of tension, compression, and shear. If a straight ribbon of material is twisted about its longitudinal axis, the material closest to the axis will experience compression, while that at the edges will experience tension. The tension arises because the spiral path now taken by the edges is longer than the straight-line path described by the edges of the untwisted material. Compression of the interior portion arises when the outer portions in tension do not elongate to relieve the tensile stress.

Nevertheless, it is fair to say that a half-turn twist applied to a ribbon that is considerably longer than it is wide produces such reductions in compression and tension, when compared to conventional bending (and especially small radius bending), that the forces of compression and tension associatd with such torsion may be safely ignored. This is justified, since the resulting gradients of compression and tension are quite small, as a result of being distributed over the entire ribbon rather than being concentrated in one local area. Likewise, shear stress in a long flexible ribbon subjected to a torsional rotation of one half-turn is distributed over a wide area, and thus does not contribute to fatigue.

In a preferred embodiment, region 20 of the U-shaped portion 19 passes through hole 12 in FIG. 3, while region 21 passes through hole 13. That and other possibilities are the subject of FIG. 5-7, to which we now turn.

Figure 5:
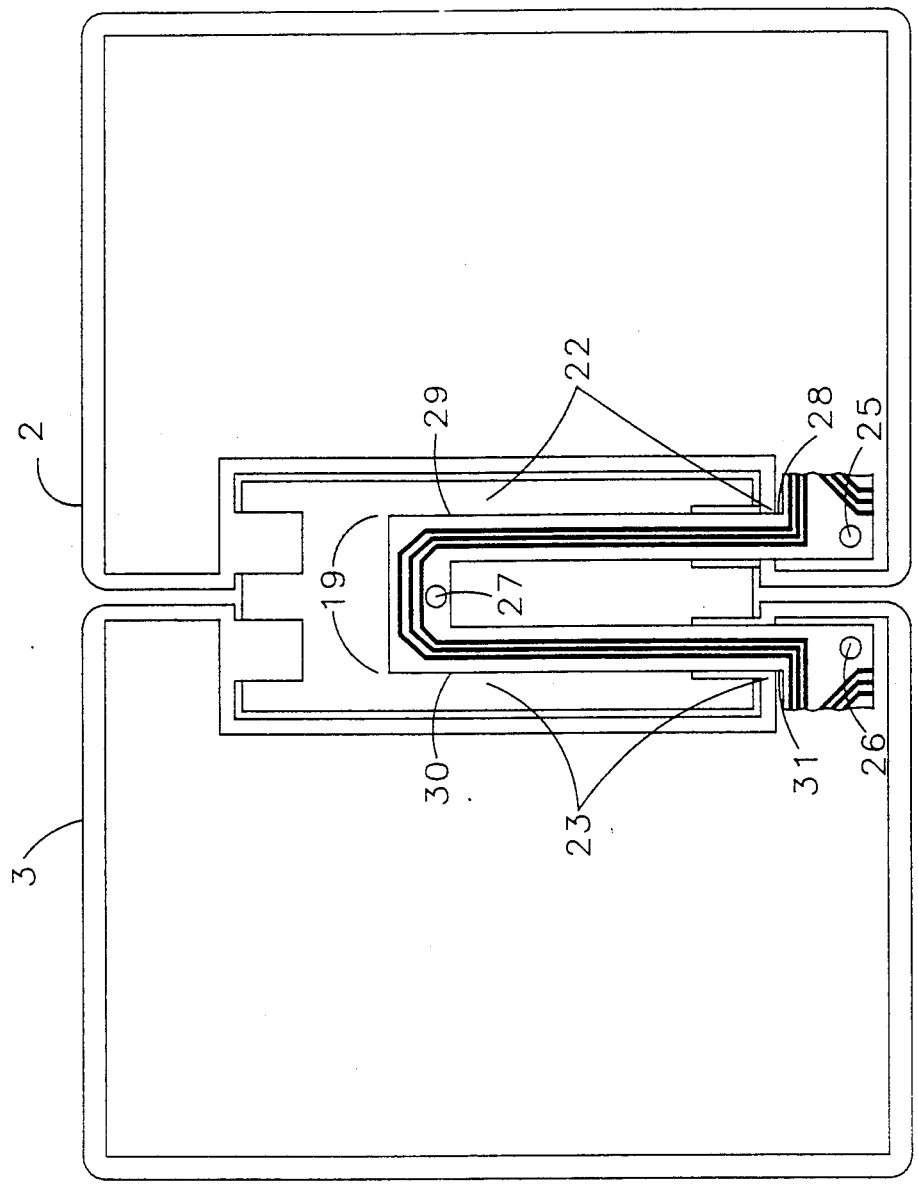
FIG. 5 is a sectional view of FIG. 2B illustrating in detail how the U-shaped portion of the flexible membrane keyboard assembly of FIG. 4 transits the articulated hinge.
Figure 6:
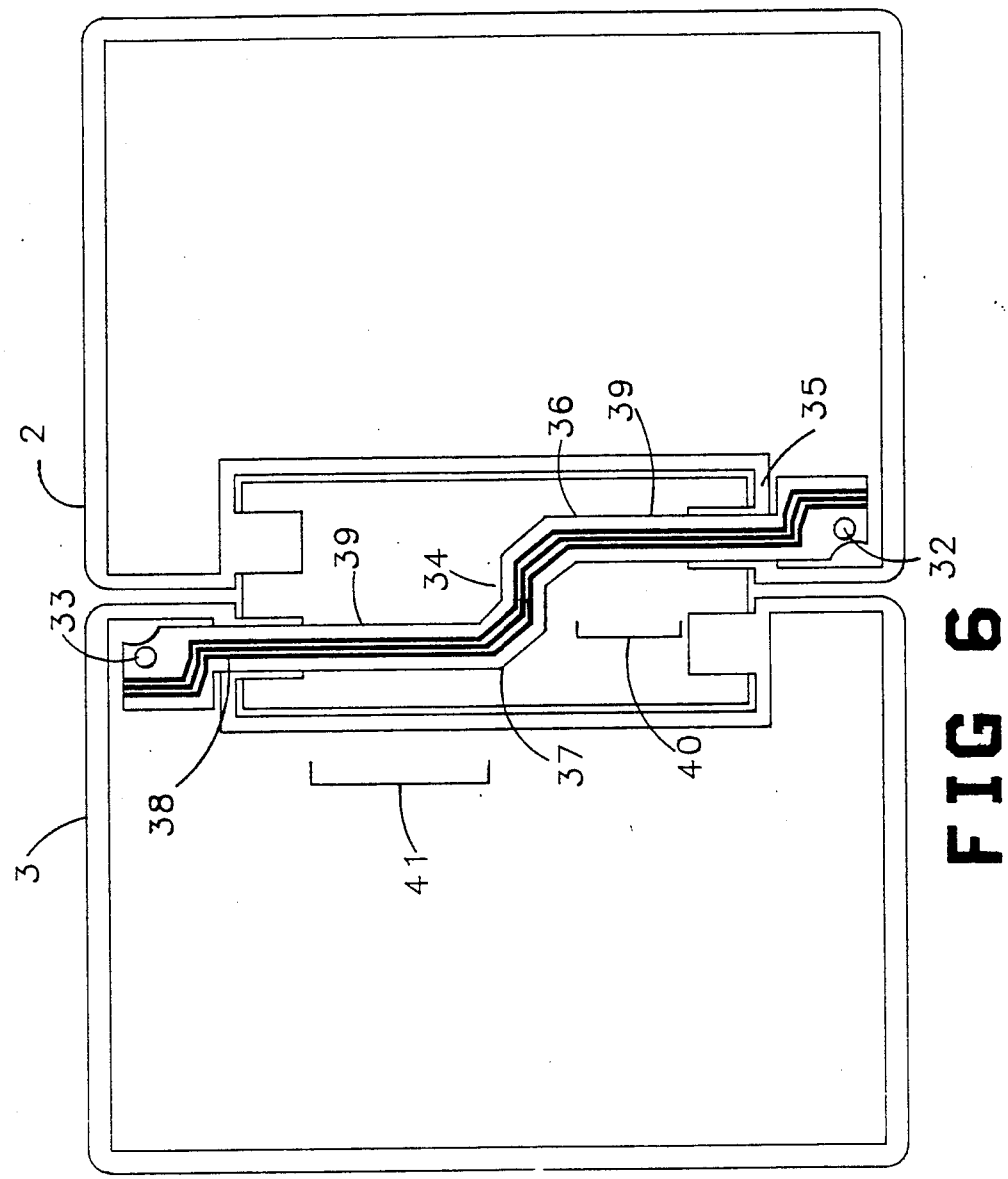
FIG. 6 is a sectional view of FIG. 2B similar to that of FIG. 5, except that the flexible conductors of the membrane keyboard assembly exhibit an abrupt job instead of a U-shaped turn.
Figure 7:
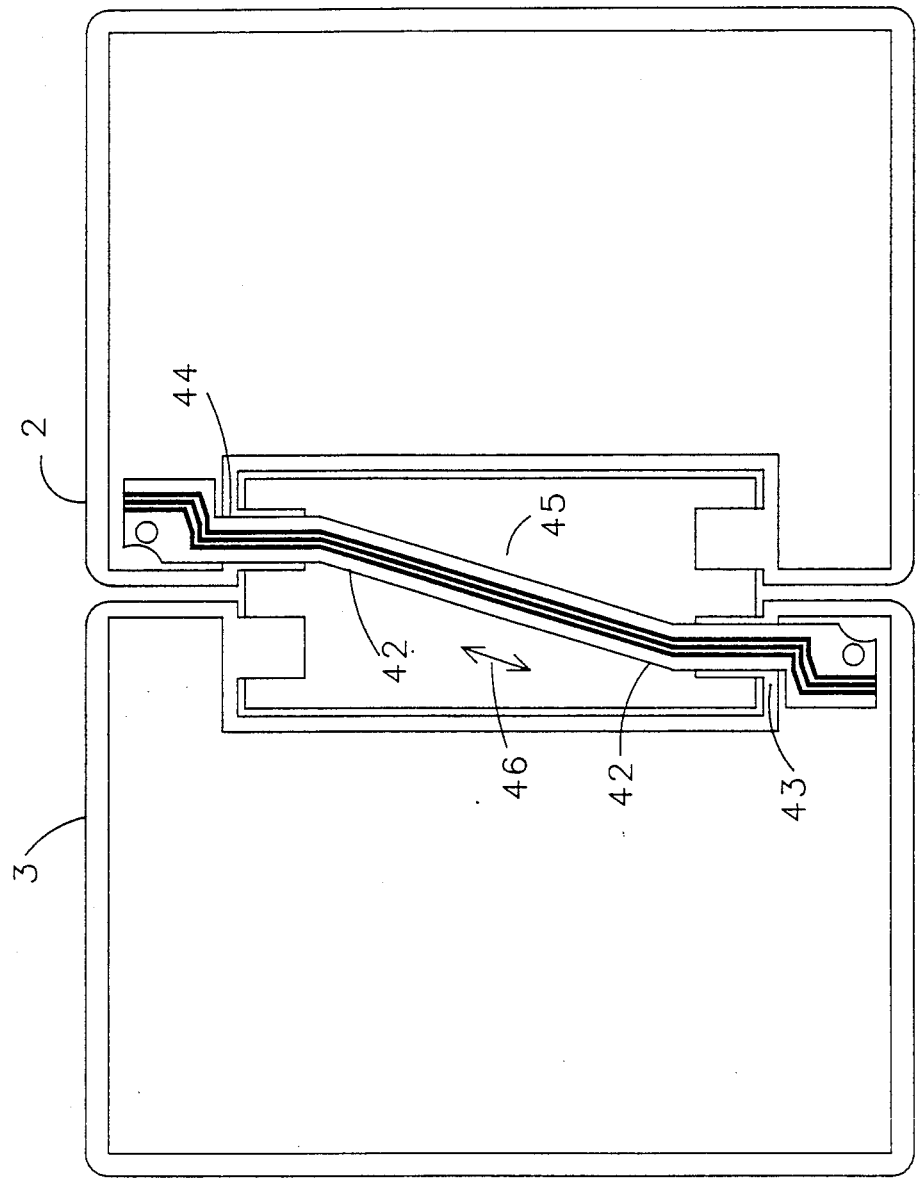
FIG. 7 is another sectional view of FIG. 2B showing yet another alternate possibility for routing the conductors through the articulated hinge.

FIG. 5 is a sectional view of FIG. 2B, illustrating a preferred way to connect the two halves 17 and 18 of the flexible membrane keyboard assembly 16 of FIG. 4. The view afforded by FIG. 5 may be thought of as being obtained as follows. As will be described in connection with FIG. 8, the articulated hinge 7 is formed of top and bottom halves meeting each other generally in the plane containing the two axes of rotation 14 and 15. In FIG. 5 (and also in FIGS. 6 and 7) the top half of the articulated hinge 7 has been removed. In a similar fashion, case halves 2 and 3 each consist of outer case portions and interior keyboard retaining surfaces. In FIGS. 5-7 the keyboard retaining surfaces (and the keyboards beneath them) have also been removed.

The view shown in FIG. 5 is indicative of the manner in which the calculator 1 is assembled. That is, bottom portions of the case halves 2 and 3 and of the articulated hinge 7 are brought into alignment and the flexible membrane keyboard assembly 16 registered thereon. To this end, holes 25, 26, and 27 fit over corresponding studs (not shown). Other parts are added, such as the keys themselves, and then the top portions of the case halves and hinge are attached (e.g. with an adhesive) to their corresponding bottom portions. The result of that is then the view shown in FIG. 1.

In particular, FIG. 5 shows the U-shaped section 19 as being located within an interior portion of the hollow articulated hinge 7. As case halves 2 and 3 rotate about articulated hinge 7 the "legs" 22 and 23 of the U-shaped section 19 undergo a twisting action (torsional flexing). This torsional flexing occurs between four locations 28–31 where the flexible membrane keyboard assembly 16 is strain relieved, or made captive, by lightly pinching it between interior ribs (not shown). Such strain relief at locations 28–31 does two things. First, it limits the amount of torsional flexing of any one leg to the amount of rotation experienced by the corresponding axis of rotation. Second, under conditions of maximum rotation of the case halves 2 and 3, it ensures that the overall torsional flexing experienced by the U-shaped section 19 is divided equally between legs 22 and 23.

FIG. 6 illustrates an alternate embodiment similar to that shown in FIG. 5. The difference is that, instead of relying upon a U-shaped bend to go from being aligned with one axis of rotation to the other, interconnecting portion 39 instead uses a jog 34. As before, holes 32 and 33 serve to register the flexible membrane keyboard assembly 16 over alignment studs (not shown) in the case and hinge parts. Reference numerals 35-38 denote locations where strain relief is provided. The torsional flexing occurrs in leg portions 40 and 41.

In the embodiments of both FIG. 5 and FIG. 6 the leg portions 22, 23, 40, and 41 are essentially centered along the axes of hinge rotation 14 and 15. By virtue of that and of there being a strain relief at each end of legs 22, 23, 40, 41, the interconnecting portions 19 and 39 each experience only torsional flexing and no conventional bending. In particular, note that the U-shaped bend itself, between strain relief locations 29 and 30, and the jog 34 between locations 36 and 37, each remain free of any bending whatsoever. The absence of the pronounced compression and tension induced by conventional bending greatly prolongs the life of the conductors routed through the hinge.

FIG. 7 illustrates another possible embodiment. In FIG. 7 the interconnecting portion 42 of the flexible membrane keyboard assembly 16 is simply a straight run from one case half to the other. It does not run parallel to either axis of hinge rotation. Accordingly, it will experience some slight amount of conventional bending at the locations of strain relief 43, 44, and 45. At location 45 the strain relief is a "slip fit", allowing the interconnecting portion 42 to slide back and forth in the direction of the double-headed arrow 46, but preventing motion in any other direction.

In summary, it can be seen that the method of the invention includes the following steps. First and second assemblies to be interconnected by conductors are hinged together by a hollow articulated hinge. The conductors are passed through an orifice in the first assembly centered about a first axis of hinge rotation. The conductors are clamped to the first assembly in close proximity to where they exit therefrom into the hollow articulated hinge. The conductors are routed along the first axis of hinge rotation for a portion of that first axis, whereupon their routing is altered to run along a portion a second axis of hinge rotation. The conductors are clamped to the hinge where their routing is altered from one axis to the other. The conductors pass out of the hollow articulated hinge and into the second assembly through an orifice centered about the second axis of rotation, and are clamped to the second assembly in close proximity to where they enter therein from the hollow articulated hinge. Alternatively, the conductors may be routed to make a straight line transition across the hinge from one orifice to the other, with the appropriate altering of routing at each end of the straight line transition.

Figure 8:
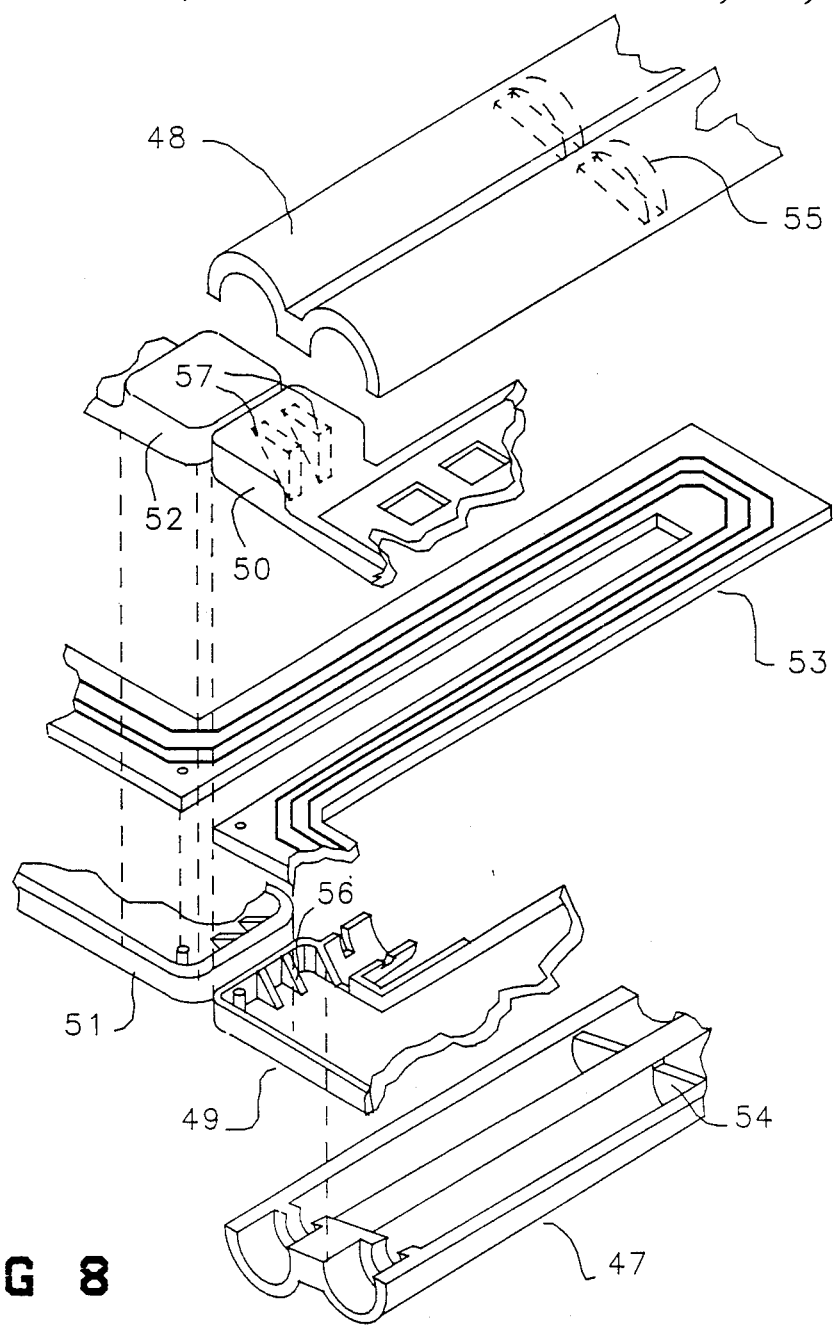
FIG. 8 is an exploded perspective view of a portion of the two case halves and articulated hinge of the calculator of FIG. 1, illustrating certain construction details.

FIG. 8 illustrates certain details of construction for the calculator 1 of FIG. 1. The purpose of the figure is to show how the various parts cooperate during assembly, so that the flexible membrane keyboard assembly 16, with its U-shaped section 19 or jogged section 39, can end up inside the case halves 2 and 3 and inside the hollow articulated hinge 7.

Observe that the articulated hinge 7 comprises a lower half 47 and an upper half 48. Similarly, case half 2 comprises a lower portion 49 and an upper portion 50, while case half 3 comprises portions 51 and 52. While these portions are apart the flexible conductors 53 (which may be a portion 19 or 39 of flexible membrane keyboard assembly 16) may be registered onto parts 49, 47, and 51.

Strain relief ribs 56 and 57 of case half 2, and their counterparts in case half 3, gently pinch the flexible conductors 53. Strain relief ribs 54 and 55 perform the same functions in the articulated hinge assembly 7.

We claim:

1. A method of routing conductors from a first assembly to a second assembly, rotatable about the first, comprising the steps of:
   hinging the first and second assemblies together with a hollow articulated hinge;
   passing the conductors from the first assembly into the hollow articulated hinge through an orifice in the first assembly centered about a first axis of hinge rotation;
   clamping the conductors to the first assembly in close proximity to where they exit therefrom into the hollow articulated hinge;
   routing the conductors within the hollow articulated hinge along the first axis of hinge rotation for a portion of that first axis;
   altering the routing of the conductors from running along the first axis to running along a second axis of hinge rotation;
   routing the conductors within the hollow articulated hinge along the second axis of hinge rotation for a portion of that second axis;
   clamping the conductors to the hollow articulated hinge at one end of the portion of the first axis where the step of altering the routing routes the conductors from running along the first axis and at one end of the portion of the second axis where the step of altering the routing routes the conductors to running along the second axis;
   passing the conductors from the hollow articulated hinge into the second assembly through an orifice therein centered about the second axis of hinge rotation; and
   clamping the conductors to the second assembly in close proximity to where they enter therein from the hollow articulated hinge.

2. A method of routing conductors from a first assembly to a second assembly, rotatable about the first, comprising the steps of:
   hinging the first and second assemblies together with a hollow articulated hinge;
   passing the conductors from the first assembly into the hollow articulated hinge through an orifice in the first assembly centered about a first axis of hinge rotation;
   clamping the conductors to the first assembly in close proximity to where they exit therefrom into the hollow articulated hinge;
   routing the conductors within the hollow articulated hinge along a straight line path to the orifice centered about the second axis recited below;
   clamping the conductors to the hollow articulated hinge at approximately the middle of the straight line path;
   passing the conductors from the hollow articulated hinge into the second assembly through an orifice therein centered about the second axis of hinge rotation; and
   clamping the conductors to the second assembly in close proximity to where they enter therein from the hollow articulated hinge.

* * * * *